(12) United States Patent
Nguyen et al.

(10) Patent No.: US 6,938,226 B2
(45) Date of Patent: Aug. 30, 2005

(54) 7-TRACKS STANDARD CELL LIBRARY

(75) Inventors: Helena H. Nguyen, San Jose, CA (US); Larry L. Chau, Fremont, CA (US); Trang Pham, Milpitas, CA (US); Tam Dinh Thanh Nguyen, Fremont, CA (US)

(73) Assignee: Infineon Technologies AG, Munich (DE)

( * ) Notice: Subject to any disclaimer, the term of this patent is extended or adjusted under 35 U.S.C. 154(b) by 295 days.

(21) Appl. No.: 10/346,970

(22) Filed: Jan. 17, 2003

(65) Prior Publication Data

US 2004/0143797 A1 Jul. 22, 2004

(51) Int. Cl.$^7$ ............................................. G06F 17/50
(52) U.S. Cl. ............................................. 716/1; 716/12
(58) Field of Search ............................ 716/1, 7, 8, 11, 716/12, 17

(56) References Cited

U.S. PATENT DOCUMENTS

| | | | | |
|---|---|---|---|---|
| 5,872,716 A | * | 2/1999 | Yano et al. ..................... 716/1 |
| 6,467,074 B1 | * | 10/2002 | Katsioulas et al. ........... 716/17 |
| 6,675,361 B1 | * | 1/2004 | Crafts ........................... 716/2 |

* cited by examiner

*Primary Examiner*—Stacy A. Whitmore
*Assistant Examiner*—Paul Dinh
(74) *Attorney, Agent, or Firm*—Bever, Hoffman & Harms, LLP; Patrick T. Bever

(57) ABSTRACT

A 7-track standard cell library having a layout architecture that is designed for fabrication technologies having design rules of 0.12 microns or smaller. The cells are laid out using a routing grid having horizontal and vertical grid spacings of 0.4 microns, such that the height of each 7-track standard cell is 2.8 microns (i.e., seven track spacings based on a horizontal grid spacing of 0.4 microns). Power rails are implemented using M1 structures. The seven-track cell height is divided into four tracks on the P-side and three tracks on the N-side. Complex cells include one internal connection line (structure) formed using the third metal layer (M3) that is introduced in a predetermined track (e.g., the second track from the top of the cell) to facilitate the seven-track layout.

14 Claims, 9 Drawing Sheets

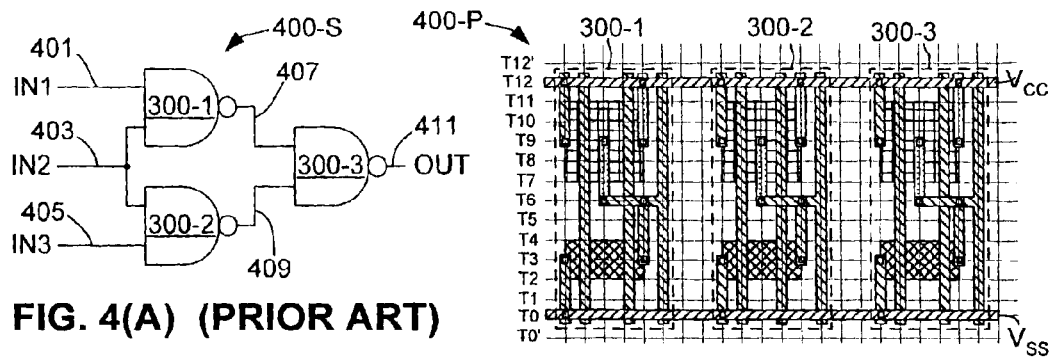
FIG. 4(A) (PRIOR ART)
FIG. 4(B) (PRIOR ART)
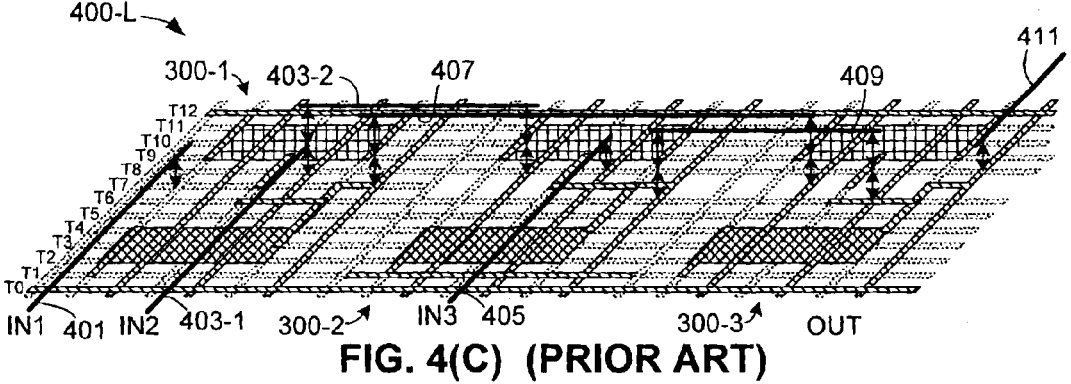
FIG. 4(C) (PRIOR ART)
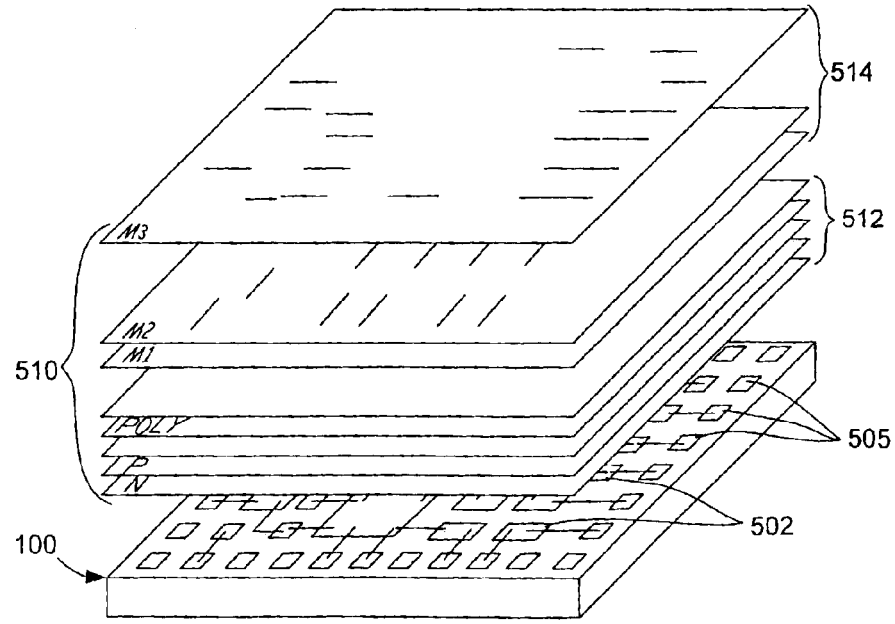
FIG. 5 (PRIOR ART)

7-TRACKS STANDARD CELL LIBRARY

FIELD OF THE INVENTION

The present invention relates generally to Application-Specific Integrated Circuits (ASICs), and more particularly to standard cell libraries utilized to form ASICs.

BACKGROUND OF THE INVENTION

FIG. 1 is a simplified flow diagram illustrating a simplified conventional process for designing and fabricating an Application-Specific Integrated Circuit (ASIC) 100 using a standard cell library 101 that is stored in a computer or workstation 110. Standard cell library 101 typically includes several hundred predefined "cells", which are predefined circuit design components that can be selectively combined using a logic design entry software tool 113 to "capture" a user's circuit design. In one embodiment, the user utilizes an input device (e.g., a mouse and/or keyboard) to select graphical representations of selected cells from library 101, and to link input and output terminals of the selected cells to form a circuit schematic representation of his/her circuit design. Once the logic design is entered, place and route tools 117, also loaded on computer 110, are utilized to generate a place-and-route solution, which arranges the various interrelated cells of the logic design in an efficient two-dimensional spatial relationship that can be fabricated on a chip, and assigns predefined routing tracks that provide signal (interconnect) lines for passing signals between the interrelated cells. A layout tool 119 is then utilized to construct a three-dimensional representation of the actual circuit structures (e.g., regions of doped semiconductor, insulated regions, and metal lines) needed to implement the logic design. Next, this three-dimensional representation is used to generate a set of masks (block 120) that are then used to fabricate ASIC 100 (block 130) using known techniques.

FIG. 2 is a diagram that graphically depicts a portion of standard cell library 101. The various cells stored in standard cell library 101 can be classified in five groups: small-scale integrated (SSI) logic, medium-scale integrated (MSI) logic, datapath circuits, memories, and system-level blocks. SSI logic typically includes simple logic gates, such as AND, NAND, XOR, OR, inverter, buffers, registers and flip-flops. MSI logic typically includes medium-complexity circuits, such as decoders, encoders, adders, parity trees, and comparators. Datapath circuits typically include arithmetic/logic units (ALUs), register files, shifters, bus extractors, and inserters. The memory group includes random-access memory (RAM) circuits, read-only memories (ROMs), and content-addressable memories (CAM) of various sizes. Finally, system-level blocks includes such large-scale circuits as multipliers, microcontrollers, UARTs, and RISC cores. Frequently, SSI logic cells are provided in density-optimized and speed-optimized versions.

As depicted by the graphical representation shown in FIG. 3, each cell in standard cell library 101 includes cell layout information that defines the various structures required to fabricate that cell. For example, a two-input NAND gate cell 300 includes N-type and P-type diffusions regions, polysilicon structures, and metal structures that generate a two-input NAND-type logic gate structure when combined according to known fabrication techniques. The dimensions and relative placement of these various structures are defined in the standard cell library for use during the place, route, and layout generation procedures mentioned above. In particular, the N-type diffusion regions of NAND gate cell 300 are defined by first mask information 301, which is depicted by a first (N) mask 311 that is used when NAND gate cell 300 is included in a user's logic design. Similarly, P-type diffusion regions are depicted by second mask information 303 associated with one or more second (P) masks 313, polysicon gate and connection structures are defined by third mask information 305 associated with a third (POLY) mask 315, and metal connection structures are defined by fourth mask information 307 associated with a fourth (Metal-1 or M1) mask 317. For brevity, FIG. 3 omits additional mask information that is necessary to complete the gate structure, such as information related to via structures needed to provide electrical connections between conductive structures associated with the various depicted masks.

Most cells of a particular standard cell library are typically laid out relative to a routing grid, which defines horizontal and vertical "tracks" where the over-the-cell metal routing is formed. In particular, a standard cell's "height" is determined by the number of horizontal grid lines ("tracks") extending between the uppermost and lowermost points of the cell, and the cell's "width" is determined by of vertical grid lines ("tracks") extending between the leftmost and rightmost points of the cell. Typically, to facilitate the placement and routing process, most cells of a standard cell library have the same height (or multiples thereof), and the uppermost and lowermost horizontal tracks of the standard cell are reserved for power ($V_{DD}$) and ground ($V_{SS}$), respectively. For example, referring to mask 317 in FIG. 3, NAND gate cell 300 is defined by a height of twelve horizontal tracks (i.e., tracks T0 through T12), with track T0 reserved for carrying ground voltage $V_{SS}$, and track T12 reserved for carrying system voltage $V_{DD}$. By defining all other SSI and MSI cells using this twelve-track format, blocks of constant or near-constant height can be formed during placement and layout. Note that the size of each cell is adjusted according to its width: for example, NAND gate cell 300 has a width of five vertical tracks (i.e., tracks V0 through V5), whereas a more complex cell may have a width of ten, twenty, or more vertical tracks. Complex cells, such as memories and system-level blocks, may have "double-height" arrangements where two-sets of twelve tracks are combined in a mirror arrangement (i.e., with the respective $V_{SS}$ tracks formed adjacent to each other).

FIGS. 4(A), 4(B), and 4(C) illustrate a schematic diagram, a placement solution, and a layout solution for a simplified logic design using conventional methods.

Referring to FIG. 4(A), a schematic representation 400-L is entered using an entry tool (e.g., logic design entry tool 113; see FIG. 1) by a user. Schematic representation 400-L includes three NAND gate cells 300-1, 300-2, and 300-3, each NAND gate cell being identical to NAND gate cell 300, which is described above with reference to FIG. 3. Signal lines (nets) are also designated using the entry tool. For example a first net 401 is defined for transmitting an input signal IN1 to NAND gate 300-1, a second input line 403 transmits an input signal IN2 to terminals of NAND gate 300-1 and 300-2, and a third input line 405 transmits an input signal IN3 to the second terminal of NAND gate 300-2. The output terminal of NAND gate 300-1 is connected by a net 407 to a first input terminal of NAND gate 300-3, and the output terminal of NAND gate 300-2 is connected by a net 409 to a second input terminal of NAND gate 300-3. The output terminal of NAND gate 300-3 is connected to a net 411.

FIG. 4(B) is a top view showing an exemplary placement solution 400-S for schematic 400-S (FIG. 4(A)). Note that by defining the cells of standard cell library 101 (FIG. 1) according to a predetermined number of horizontal tracks, placement solution 400-S is greatly simplified and highly space efficient. In particular, because each NAND gate has the same height, and because M1 tracks T12 and T0 are reserved for power ($V_{DD}$) and ground ($V_{SS}$), respectively, NAND gate cells 300-1 through 300-3 can be arranged in the highly efficient manner shown in FIG. 4(B). As indicated, the cells may be arranged in horizontal groups that are inverted such that tracks T12 and T0 are adjacent to tracks T12' and T0' of adjacent cells. In other instances, as mentioned above, a single complex cell may be formed by combining two horizontal groups in a "double-height" arrangement.

As mentioned above, in most standard cell ASICs, the first metal (M1) layer are typically utilized to complete internal cell connections, and subsequent metal layers (e.g., M2, M3, etc.) are typically utilized to provide the external routing structures used to connect associated cells to form the desired completed ASIC. In many instances, above first metal M1, the even metal layers (M2, M4, etc.) are utilized to provide vertical routing channels that are connected by via structures to the underlying polysilicon and/or M1 structures, and odd metal layers (M3, M5, etc.) are utilized to provide horizontal routing channels. For example, FIG. 4(C) is a perspective view showing a simplified routing solution 400-L, which contact vias indicated by double-headed arrows for convenience. Second metal (M2) lines are indicated by heavy black vertical lines (i.e., perpendicular to horizontal tracks T1–T12), and third metal (M3) lines are indicated by heavy black horizontal lines (i.e., parallel tracks T1–T12). In effect, each "track" represents a potential routing path that is used to connect together NAND cells 300-1, 300-2, and 300-3. According to routing solution 400-L, signal lines 401, 403-1, 405, and 411 are implemented using M2 (vertical) metal lines extending along vertical track V1, and signal lines 403-2, 407, and 409 are implemented using M3 (horizontal) metal lines. Note that signal lines 403-1 and 403-2 form net 403 of FIG. 4(A). In this manner, all of the external cell connections associated with a logic design are implemented using the M2 and M3 metal layers of the associated CMOS fabrication process. Thus, in a given completed ASIC device, all of the cells may be completely covered by horizontal and vertical routing lines. By reserving the metal layers above M1 (e.g., M2, M3, etc.) for external routing connections in a standard cell ASIC, automatic placement and routing of the ASIC is greatly simplified, resulting in very good cell placement densities.

FIG. 5 is a perspective view depicting a mask set 510 superimposed over standard cell ASIC 100, which was introduced in FIG. 1. Mask set 510 represents the final (fabrication) step in which the placement and routing solutions discussed above are used to form mask set 510, which is then used during the fabrication of ASIC 100. Note that standard cell ASIC 100 includes a plurality of cells 502 and surrounding bonding pads 505 that are laid-out in the manner defined during the place-and-route process (described above). Mask set 510 includes a first group 512 of masks that include predefined structures used to form cells 502, pads 505, and other predefined structures of device 100. For example, first group 512 includes the P mask, N mask and POLY mask indicia associated with NAND cell 300 (described above), along with structures associated with all of the other cells, arranged in the manner determined during the placement process. Mask set 510 also includes a second group 514 of masks associated with the metal layers used to complete internal cell connections and external cell routing structures in the manner described above.

A problem associated with the conventional standard cell ASICs described above is that restricting internal cell connections to the first metal (M1) layer necessarily requires a large cell height (i.e., cells that span a large number of horizontal tracks). For example, most current standard cell libraries are similar to cell library 101 in that all SSI and MSI cells have cell heights of ten to twelve tracks or more (using 0.12 um technology). This relatively large cell height produces a larger transistor size and layout size. Therefore, ASICs formed using such conventional standard cell libraries exhibit relatively high power consumption, high loads, greater wire capacitance (due to the larger cell sizes), and larger layout sizes. In addition, this larger cell height results in ASICs that take up most of the standard cell core area, making ASIC chips bigger and bigger, and causing significant power distribution problems.

One approach to addressing the above problem would be to simply design a standard cell library based on a smaller cell height (e.g., less than ten horizontal tracks). However, while the design of many SSI cells based on such smaller cell heights is relatively easy, more complex cells require elaborate and extremely long cell widths to complete all necessary internal connections using M1 lines. That is, by eliminating the number of horizontal routing channels over which internal cell connections can be made by M1 structures, the width of certain complex cells must be "stretched" to accommodate all necessary connections. Accordingly, by decreasing the number of horizontal routing channels without decreasing transistor size, the size of some complex cells can actually increase. Further, when the number of horizontal routing channels is too small, in some instances it simply becomes impossible to make all necessary internal connections using M1 structures.

What is needed is a method for developing a standard cell library such that the cells have a reduced cell height without increasing the size of complex cells.

SUMMARY

The present invention is directed to a 7-track standard cell library having a layout architecture that is designed for fabrication technologies having design rules of 0.12 microns (um) or smaller. The cells are laid out using a routing grid having horizontal and vertical grid spacings of 0.4 um, such that the height of each 7-track standard cell is 2.8 um (i.e., seven track spacings based on a horizontal grid spacing of 0.4 um). Power rails (i.e., $V_{DD}$ and $V_{SS}$) are implemented using M1 structures, and are shared when cells are abutted (e.g., 0.52 um total rail width for abutted cells). The power rails of all cells have a hard tie layout that extends along the top and bottom cell boundaries (i.e., along the uppermost and lowermost horizontal track). All cell pins only access M1 structures, which makes connection more accessible for M2 and M3 global connections. The seven-track cell height is divided into four tracks on the P-side and three tracks on the N-side. Using 0.12 um technology, due to design rules, maximum P-channel transistor width is 0.80 um and maximum N-channel transistor width is 0.58 um. Therefore, the standard cell library is based on a P/N ratio in the range of 1.3 to 1.5, and more particularly 1.38), which is ideal for producing ASICs using fabrication technologies having design rules of 0.12 um or smaller.

In accordance with an aspect of the present invention, selected complex cells of the standard cell array include one internal connection line (structure) formed using the third metal layer (M3) that is introduced in a predetermined track (e.g., the second track from the top of the cell) to facilitate the seven-track layout. As discussed above, a problem associated with producing a standard cell scheme having reduced cell height is that there is typically insufficient M1 routing space for certain complex cells, and a problem associated with using M2 or M3 resources to fix this problem is that global routing can be greatly complicated or blocked entirely. By utilizing only one line restricted to a designated track in each complex cell, the present invention avoids the routing resource problem associated with reducing the cell height using conventional techniques, while minimizing the problems associated with global routing.

According to another aspect of the present invention, an ASIC produced using the 7-track standard cell array described herein has layout area that is at least 30% smaller and uses approximately 50% less power than ASICs produced using conventional standard cell ASICs using 0.12 um fabrication techniques and utilizing the same operating voltage (e.g., 1.35 Volts). By reducing the layout size of each ASIC, overall production yields are increased, thereby significantly reducing per-chip manufacturing costs. Moreover, only a small speed penalty (between 2 and 7%) is introduced in ASICs produced using the 7-track standard cell library, when compared to ASICs produced using conventional 0.12 um standard cell libraries having 10 or 12 tracks. Further, ASICs produced using the 7-track standard cell library support substantially lower operating voltages (e.g., 0.72 Volts, versus the 1.35 Volts typically utilized in conventional 0.12 um standard cell ASICs), thereby facilitating power savings of up to 82% (although this lower operating voltage can introduce a speed penalty of approximately 67%)

The present invention is also directed to a method for generating a low-power standard cell library for ASICs produced using 0.12 um technologies (or smaller) that utilize the 7-track standard cell template described herein.

BRIEF DESCRIPTION OF THE DRAWINGS

These and other features, aspects and advantages of the present invention will become better understood with regard to the following description, appended claims, and accompanying drawings, where:

FIG. 4(A) is a circuit diagram showing an exemplary circuit;

FIG. 4(B) is a plan view showing several cells of FIG. 2 laid out to form the circuit of FIG. 4(A);

FIG. 4(C) is a perspective view showing external routing connections between the cells of FIG. 4(B) to complete the circuit of FIG. 4(A);

FIG. 5 is an exploded perspective view depicting various masks used to form an ASIC according to conventional techniques;

DETAILED DESCRIPTION OF THE DRAWINGS

Figure 1:
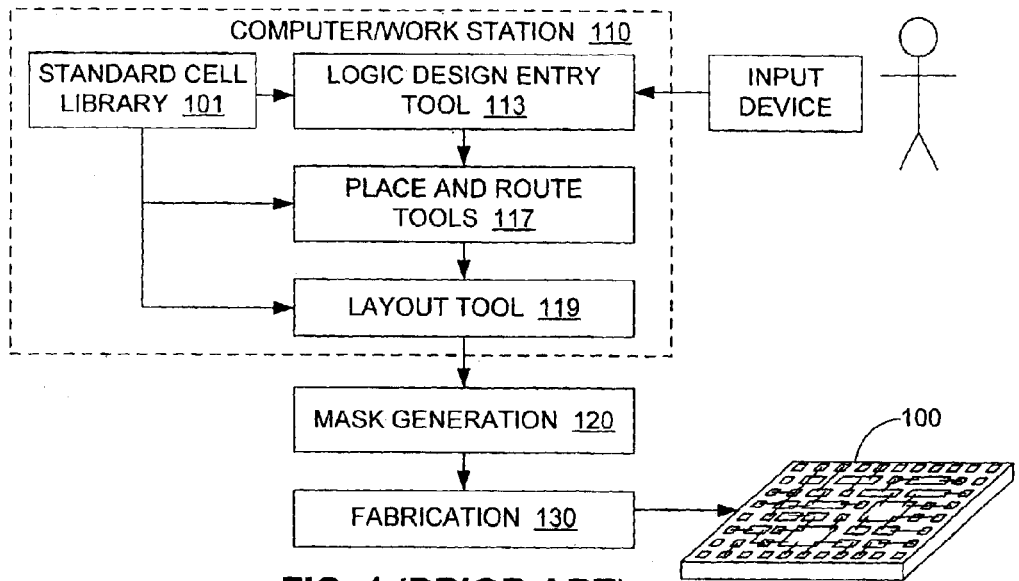
FIG. 1 is a flow diagram showing a conventional method for designing an ASIC using a standard cell library.
Figure 2:
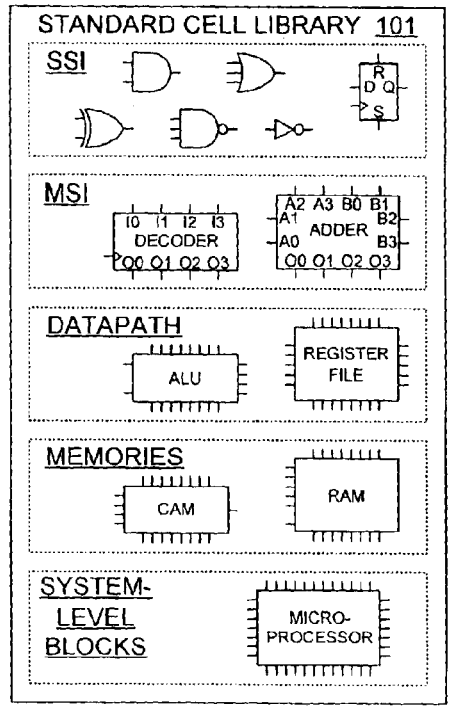
FIG. 2 is simplified diagram graphically depicting a conventional standard cell library.
Figure 3:
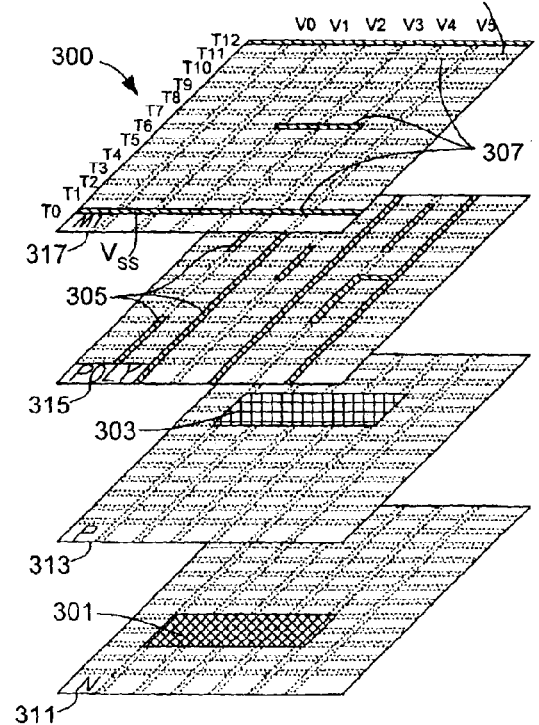
FIG. 3 is an exploded perspective view showing a cell of the standard cell library of FIG. 2.
Figure 6:
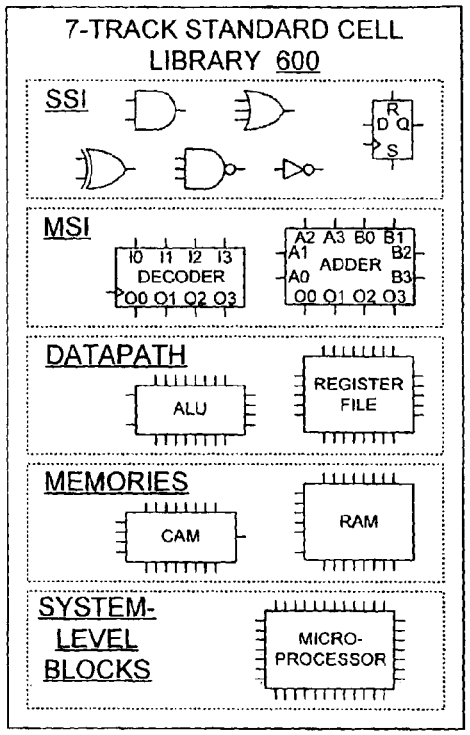
FIG. 6 is a simplified diagram graphically depicting a 7-track standard cell library according to the present invention.

FIG. 6 is a diagram graphically depicting a standard cell library 600 according to an embodiment of the present invention. Similar to conventional standard cell libraries, standard cell library 600 includes a plurality of cells that can be separated into five groups: small-scale integrated (SSI) logic, medium-scale integrated (MSI) logic, datapath circuits, memories, and system-level blocks. Each group generally includes the logic gates and circuits described above with reference to the conventional library. However, as discussed in additional detail below, standard cell library 600 differs from conventional standard cell libraries in that its cells have a nominal cell height of seven routing grid tracks (hence, a "7-track standard cell library"), and have a layout architecture that is designed for CMOS fabrication technologies having design rules of 0.12 microns (um) or smaller. As discussed above, conventional standard cell libraries based on 0.12 um CMOS technology have a cell height of ten to twelve tracks, and typically utilize a system voltage of 1.35V or higher. As set forth in detail below, by limiting cell height to seven tracks, standard cell library 600 supports a system voltage of 0.72 to 1.5 Volts, which facilitates the production of ASICs exhibiting greatly reduced power consumption when compared to conventional standard cell libraries having cell heights of ten or more tracks. Further, while standard cell library 600 is described below with reference to 0.12 um technologies operating on 1.35V or 0.72V system voltages, standard cell library 600 may also be utilized in conjunction with even smaller fabrication technologies (i.e., below 0.12 um) to facilitate the production of ASICs using even lower system voltages.

Figure 7:
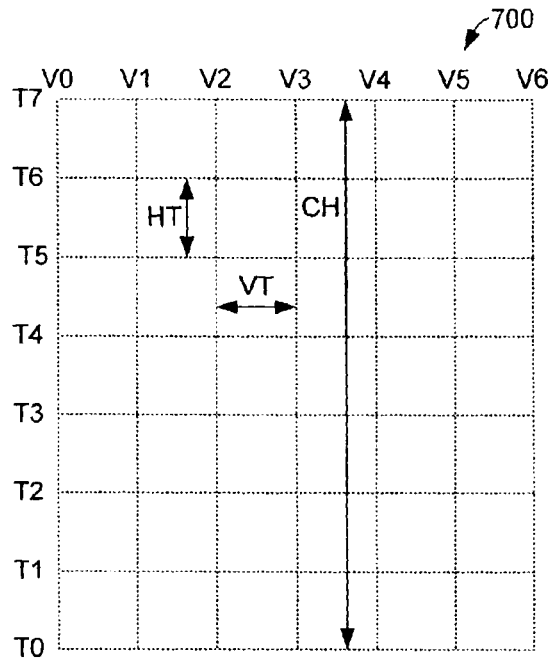
FIG. 7 is a simplified diagram showing a routing grid pattern utilized to form the various cells of the 7-track standard cell library.
Figure 8:
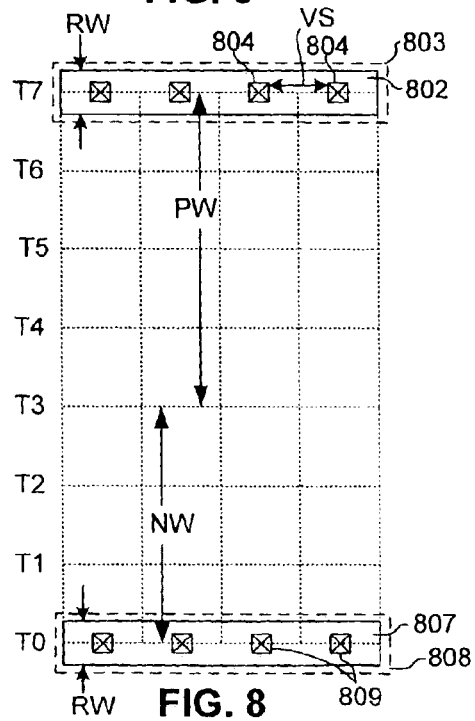
FIG. 8 is a simplified diagram showing power rail alignments and N-channel/P-channel transistor regions utilized to form the various cells of the 7-track standard cell library.
Figure 9:
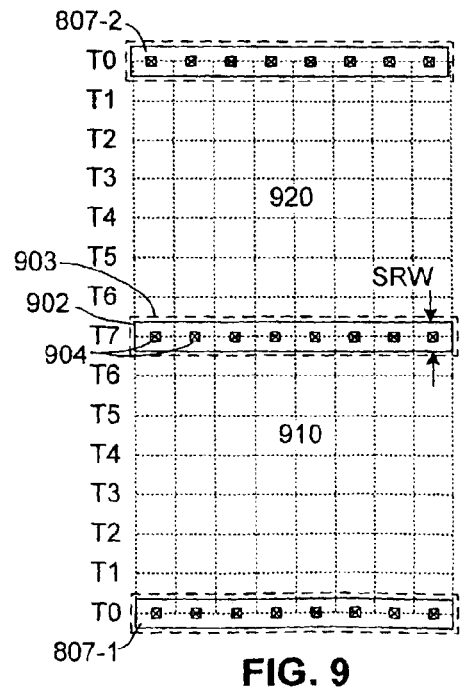
FIG. 9 is a simplified diagram showing a shared power rail arrangement associated with the formation of some cells of the 7-track standard cell library.

FIGS. 7 through 9 are simplified diagrams illustrating a routing grid pattern and layout features that are utilized in the design of standard cell library 600 according to an embodiment of the present invention.

Referring to FIG. 7, according to an aspect of the present invention, each cell of library 600 (FIG. 6) is designed using a routing grid pattern 700 for 0.12 um or smaller fabrication technology, and is based on a 7-track cell height CH of 2.8 um, with a horizontal track spacing HT of 0.4 um, and a vertical track spacing VT of 0.4 um. As indicated, routing grid pattern 700 includes horizontal routing tracks T0 through T7, which define the cell height CH of each cell. The width of each cell, which is determined, for example, by the cell's complexity, is measured by the number of vertical routing tracks (e.g., V0 through V6) over which that cell extends. These horizontal and vertical tracks represent a routing grid utilized according to known techniques during the formation of internal connections (during cell formation) and external routing (during ASIC formation). As described in additional detail below, reducing the cell height to seven tracks, and in particular to 2.8 um (based on a 0.4 um horizontal grid spacing), facilitates the design and fabrication of cells that are significantly smaller than the cells of conventional standard cell libraries, thereby allowing the production of ASICs that are 30% smaller than ASICs produced using ten/twelve track standard cell libraries and 0.12 um fabrication technologies.

As set forth above, ASICs are typically formed using fabrication processes that include the formation of several metal layers over a semiconductor substrate (and any intervening structures). As is understood in the art, these metal layers are etched using known techniques to form routing lines or pads that facilitate the conduction of signals between corresponding circuit structures. To simplify the description herein, the structures etched from these sequentially formed metal layers are referred to herein as "M1 structures" (routing lines/pads etched from the lowermost metal layer), "M2 structures" (lines/pads etched from the next sequentially formed metal layer that is separated from M1 structures by an appropriate insulating layer), "M3 structures" (lines/pads etched from the next sequentially formed metal layer that is separated from M2 structures by another insulating layer), and so on. The CMOS 0.12 um fabrication technology utilized to form ASICs according to an embodiment of the present invention includes six metal layers (i.e., M1 through M6), although more than six or fewer than six layers may be used.

Referring to FIG. 8, according to another aspect of the present invention, the cells of library 600 (FIG. 6) include power rails 802 and 807 (which are connected, for example, to system voltage $V_{DD}$ and ground/$V_{SS}$ using known techniques) are implemented using M1 metal structures that are hard-tied (i.e., connected by a series of conductive via structures) to underlying diffusion regions aligned along the uppermost horizontal track and the lowermost horizontal track of each cell. For example, power rail 802 is aligned along uppermost track T7, and is etched from first metal layer material to form a line having a width RW of 0.52 um that is hard-tied to an associated underlying diffusion region 803 by a series of via structures 804 that formed at a spacing VS of 0.24 um (note that each via structure 804 is located midway between adjacent vertical grid lines). Similarly, power rail 807 is formed from a similar M1 structure aligned along lowermost track T0, and is hard-tied to an associated underlying diffusion region 808 by a series of via structures 809.

Referring again to FIG. 8, according to another aspect of the present invention, each cell of library 600 is laid out such that P-channel transistors are located in a region PW corresponding to the upper four-sevenths of the cell height (i.e., between track T3 and track T7), and N-channel transistors are located in a region NW corresponding to the lower three-sevenths of the cell (i.e., between track T0 and track T3). That is, during the cell design process, all P-channel transistors of a particular cell are laid out in region PW (i.e., the upper 1.6 microns of said each cell), and all N-channel transistors of the cell are laid out in region NW (i.e., the lower 1.2 microns of each cell). Accordingly, due to design rules associated with using 0.12 um technology, and based on the 0.4 um spacing of routing grid pattern 700 (explained in FIG. 7), the maximum P-channel transistor width is 0.80 um and maximum N-channel transistor width is 0.58 um.

Therefore, each cell of standard cell library 600 is based on a P/N ratio of 1.38, which the present inventors believe is ideal for producing ASICs using fabrication technologies having design rules of 0.12 um or smaller.

FIG. 9 shows a partial cell placement in which two abutted cells (or, for example, a layout arrangement for a double-wide datapath, memory, or system-level block cell) in which a centrally located power rail structure 902 is shared by both a lower cell area 910 and an adjacent upper cell area 920. In this case, shared rail structure has a width SRW of 0.52 microns, and is hard tied to a correspondingly wide diffusion region 903 by via structures 904. Note that in order to share a rail (e.g., $V_{DD}$) between two abutted cells, the layout associated with upper cell (e.g., region 920) must be inverted (i.e., rotated around an imaginary central horizontal axis) such that its uppermost track T7 is located at the same location as track T7 of the lower cell (e.g., region 910).

Figure 10:
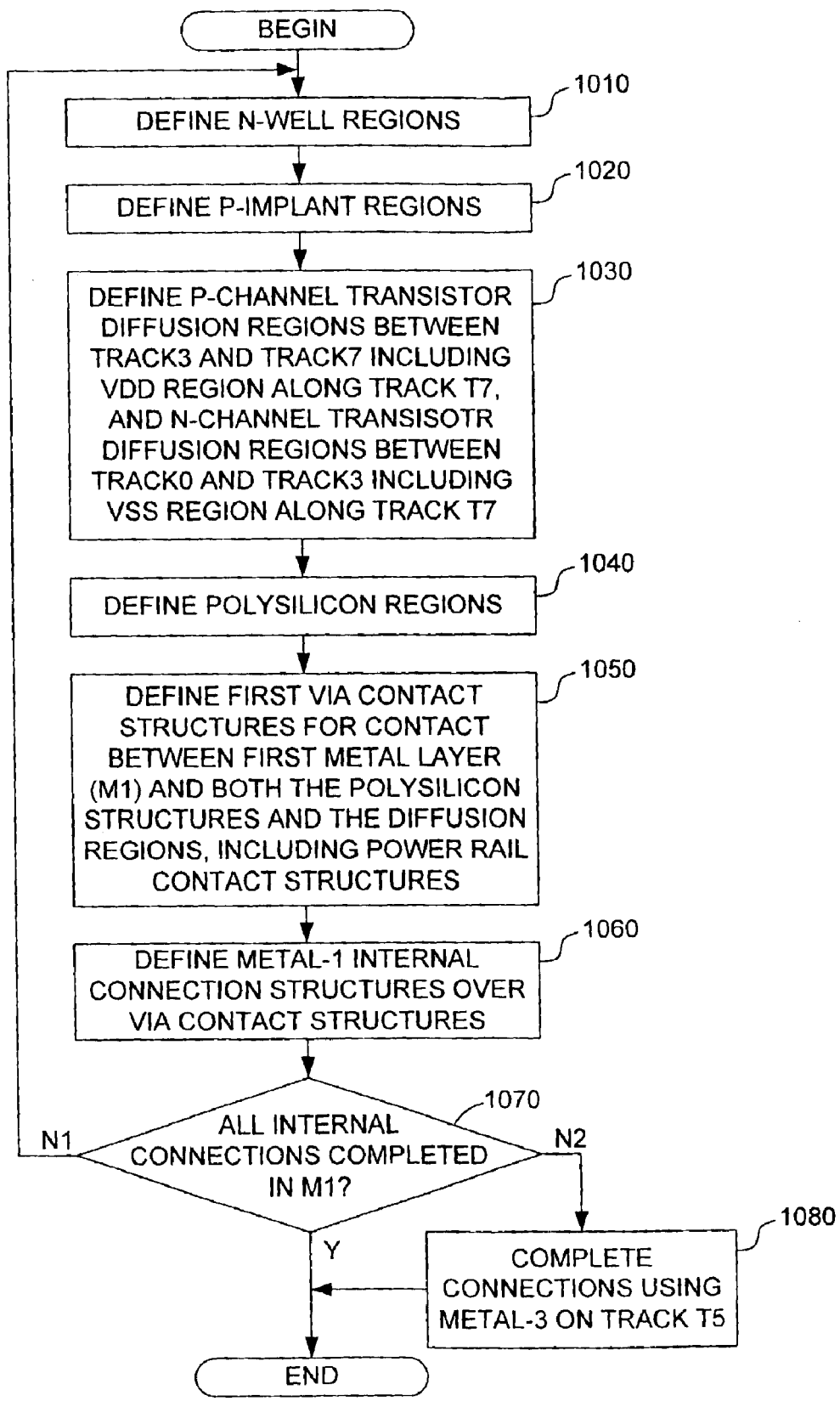
FIG. 10 is a flow diagram showing a method for forming a cell layout starting from the silicon substrate up to the metal layers of the 7-track standard cell library according to an embodiment of the present invention.

FIG. 10 is a flow diagram showing a method that utilizes the aspects mentioned above to generate a standard cell library for producing ASICs based on a fabrication technology having a feature size that is 0.12 microns or smaller according to another embodiment of the present invention. In particular, the method involves designing (forming) a plurality of cells for each of the five groups disclosed in FIG. 6 utilizing routing grid pattern 700 (see FIG. 7) and additional cell layout features discussed above with reference to FIGS. 8 and 9, and also in accordance with additional design considerations mentioned below.

The method for designing the layout for a cell starting from the silicon substrate up to the metal layers begins by defining N-well regions (block 1010) for the cell, and then defining P-implant regions (block 1020) that form the base of the subsequently formed P-channel and N-channel transistors according to known CMOS techniques.

Next, diffusion regions are defined for the P-channel transistors and the N-channel transistors of the cell (block 1030). Note that, as set forth above, the diffusion regions for forming the P-channel transistors are only located in the uppermost four tracks (i.e., between track T3 and T7) of routing grid pattern 700 (see FIG. 7), and the N-channel transistors are only located in the lowermost three tracks (i.e., between track T0 and T3). In addition, diffusions for hard-tying the power rails are provided along the uppermost and lowermost tracks. For example, a diffusion region is formed along uppermost track T7 for carrying system voltage $V_{DD}$, and a diffusion region is formed along uppermost track T7 for carrying ground/$V_{SS}$.

Next, after defining suitable insulator structures according to known techniques (not shown), one or more polycrystalline silicon (polysilicon) structures are defined (block 1040), for example, for controlling the P-channel and N-channel transistors of the cell.

Next, after defining another set of suitable insulator structures (not shown), via contact structures are defined for providing contacts between the to-be-formed first metal layer (M1) structures and corresponding underlying polysilicon structures and diffusions regions (block 1050) that extend through intervening insulation material. Note that these via structures include the via structures associated with connecting the M1 power rail structures and underlying diffusion along the uppermost and lowermost tracks (see FIG. 8).

According to another aspect of the present invention, the method next involves defining as many internal cell connections as possible using M1 structures (block 1060). The term "internal cell connections" refers to connections between associated circuit structures of a particular cell, as compared to "external routing connections" which refer to routing lines (typically structures formed by metal layers M2, M3, etc.) that are used to link selected cells in an ASIC. By utilizing M1 structures, in conjunction with the via structures, to provide as many internal cell connections as possible, the subsequent metal layers (e.g., M2, M3, etc.) are free for forming external routing connections, thereby simplifying the ASIC placement and routing process.

In accordance with another aspect of the present invention, the M1 structures are defined to support all connections to external routing structures, and defined such that these external connection points are located near the center (e.g., track T3 of the layout grid pattern (see FIG. 7) of each cell, thereby facilitating connection to M2 and M3 external routing connection structures.

Referring again to FIG. 10, if all internal routing connections are implemented using M1 structures within the external cell boundaries (Y in decision block 1070), then the cell definition process is completed. However, if all internal connections are not completed using M1 structures, then the cell designer may wish to redefine one or more of the previously-defined structures in order to facilitate completing all internal cell connections using M1 structures (branch N1 of decision block 1070).

In accordance with another aspect of the present invention, when the cell designer determines that the internal cell connections of a complex cell cannot be completed using M1 structures only (branch N2 of decision block 1070), then an M3 structure aligned along a predetermined track (e.g., track T5 of the layout grid pattern (see FIG. 7) is utilized to complete the internal connections (block 1080). As set forth above, a problem associated with producing a standard cell scheme having a 7-track cell height is that there is typically insufficient M1 routing space for certain complex cells. Further, a problem associated with using M2 or M3 resources to fix this problem is that global routing can be greatly complicated, or blocked entirely in some ASIC arrangements. By utilizing only one M3 structure (line) that is restricted to a designated track (e.g., track T5) in all of these complex cells, the present invention avoids the routing resource problem associated with the 7-track cell height, while minimizing the problems associated with global routing. That is, for a given ASIC design, because the M3 structures of any included complex cells are aligned along the predetermined track (e.g., track T5), then the routing tool is able to utilize all other M3 tracks (i.e., tracks T0 through T4, T6 and T7) to complete external routing connections without encountering the M3 structures associated with the complex cells. Further, if a given row of cells does not include a complex cell, then the router can also utilize track T5 without interruption. Note also that because all cell connections are provided in the center of each cell, the M3 structures do not interfere with external routing connections to the associated complex cell.

FIGS. 11(A) through 11(F) and 12 through 13(F) illustrate examples of cells defined in accordance with the method set forth in FIGS. 10. FIGS. 11(A) through 11(F) depict the design of an inverter 1100 (shown completed in FIG. 11(F)), which illustrates an example of a "simple" cell in which an M3 structure is not needed to complete the necessary internal cell connections. FIG. 12 and FIGS. 13(A) through 13(F) depict a circuit schematic and layout design of flip-flop circuit 1200, which illustrates an example of a "complex" cell in which an M3 structure is utilized to complete the necessary internal cell connections.

Figure 11A:
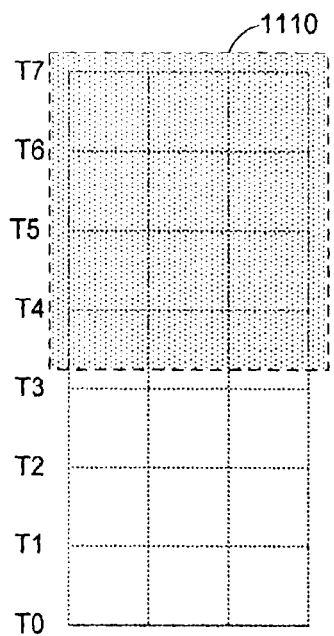
FIGS. 11(A) through 11(F) are plan views depicting the formation of a "simple" cell of the 7-track standard cell library utilizing the method of FIG. 10.
Figure 11B:
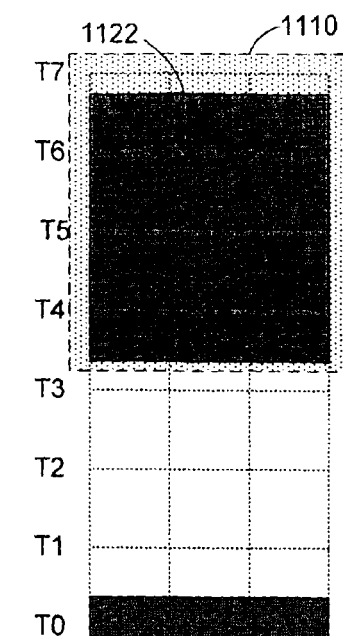
Figure 11C:
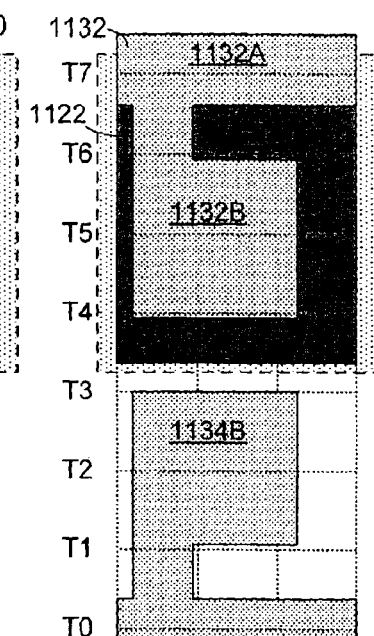
Figure 11D:
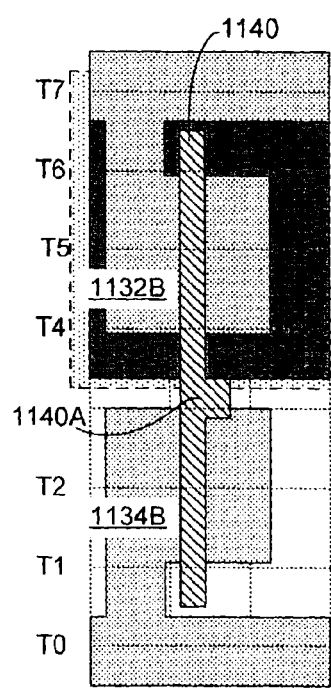
Figure 11E:
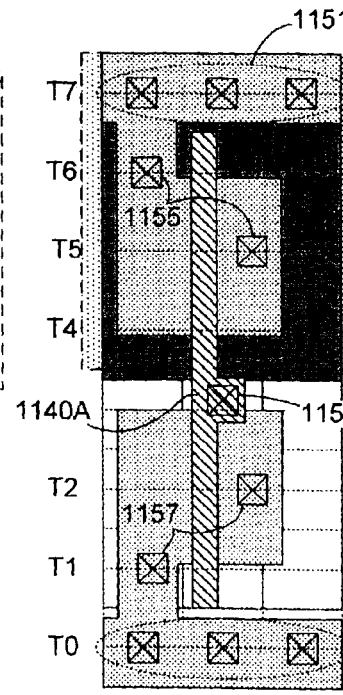
Figure 11F:
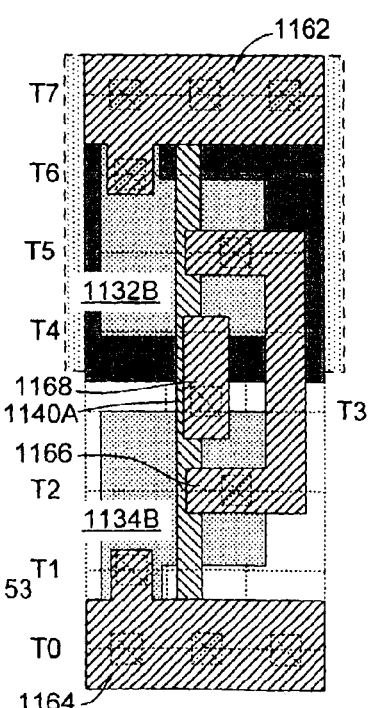

Referring to FIG. 11(A), the mask design of inverter 1100 starting from the silicon substrate up to the metal layers begins with the formation of N-well 1110 in the upper portion of the layout grid pattern (i.e., extending from a point just above track T7 to a point just above track T3). Next, as shown in FIG. 11(B), a first P-implant region 1122 is formed in N-well 1110, and a second P-implant region 1124 is formed along track T0. As shown in FIG. 11(C), diffusion regions 1132 and 1134 are then defined. Note that diffusion region 1132 includes a first portion 1132A aligned along uppermost track T7, which forms part of the $V_{DD}$ power rail structure, and a second portion 1132B, which is used to form a P-channel transistor. Similarly, diffusion region 1134 includes a first portion 1134A aligned along lowermost track T0, which forms part of the $V_{SS}$ power rail structure, and a second portion 1134B, which is used to form an N-channel transistor. Note also that diffusion 1132B is positioned above track T3, and diffusion 1134B is positioned below track T3. Next, as shown in FIG. 11(D), a polysilicon structure 1140 is defined that includes a central portion 1140A, and arms that extend upward over diffusion region 1132B, and downward over diffusion region 1134B. As shown in FIG. 11(E), via structures are then defined, which include an upper row 1151 and a lower row 1153 that form parts of the power rails, a first pair 1155 that facilitates the formation of the P-channel transistor, a second pair 1157 that facilitates the formation of the N-channel transistor, and a via 1159 formed on central portion 1140A of the polysilicon structure. Finally, as indicated in FIG. 11(F), M1 structures are defined that include an upper structure 1162 located along track T7 and contacting diffusion 1132B by associated vias, a lower structure 1164 located along track T0 and contacting diffusion 1134B by associated vias, a first central structure 1166 extending between portions of diffusion region 1132B and 1134B, and a second central portion 1168 contacting central portion 1140A of the polysilicon structure by the associated via. Note that each central M1 structure 1166 and 1168 extends across at least two horizontal tracks (e.g., M1 structure 1168 extends across tracks T3 and T4) to facilitate flexible external routing connections.

Figure 12:
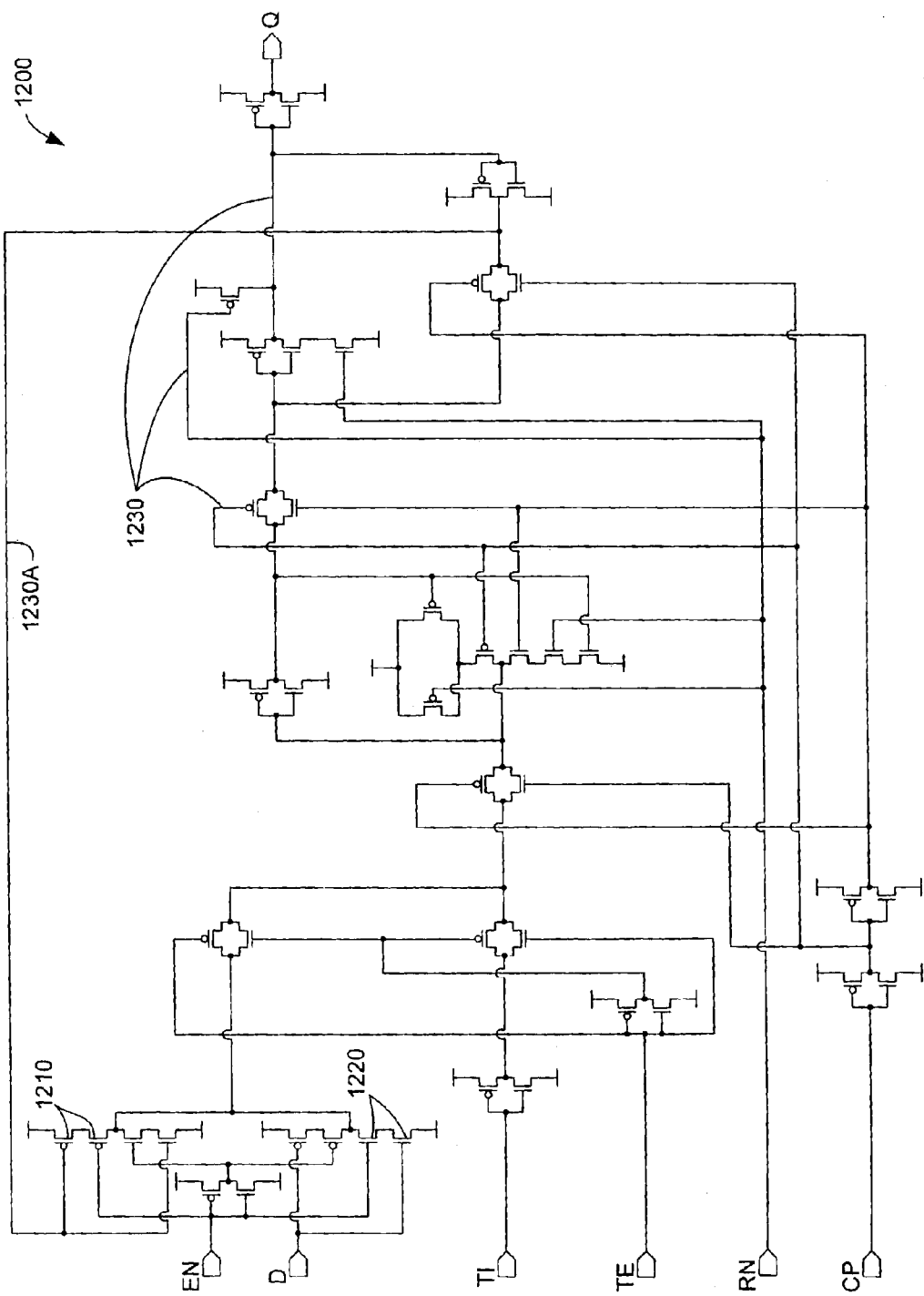
FIG. 12 is a schematic diagram showing a "complex" cell of 7-track standard cell library.

FIG. 12 is a circuit diagram showing a flip-flop circuit 1200, which represents an example of a complex cell provided by the 7-track standard cell library of the present invention. Flip-flop circuit includes various P-channel transistors 1210 and N-channel transistors 1220 that are grouped to form latches and other circuit structures necessary to perform the complex flip-flop function. Further, several nets (conductive lines) 1230 are required to connect associated groups of circuit structures. Note, in particular, feedback net 1230A that transmits a signal form circuitry located near the output terminal of flip-flop circuit 1200 with circuitry located near the input terminal of flip-flop circuit 1200.

Figure 13A:
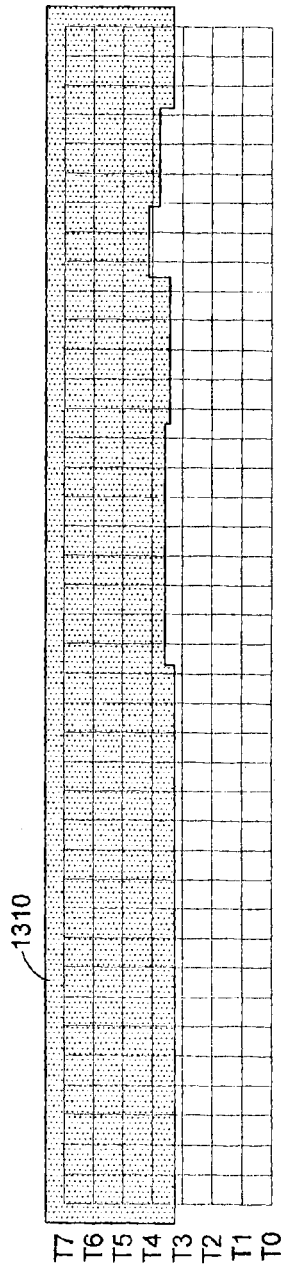
FIGS. 13(A) through 13(H) are plan views depicting the formation of the "complex" cell of FIG. 12 utilizing the method of FIG. 10.
Figure 13B:
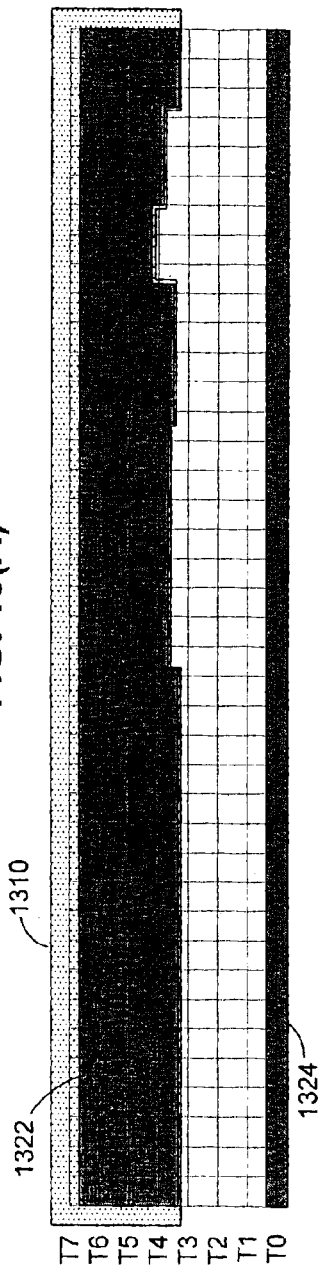
Figure 13C:
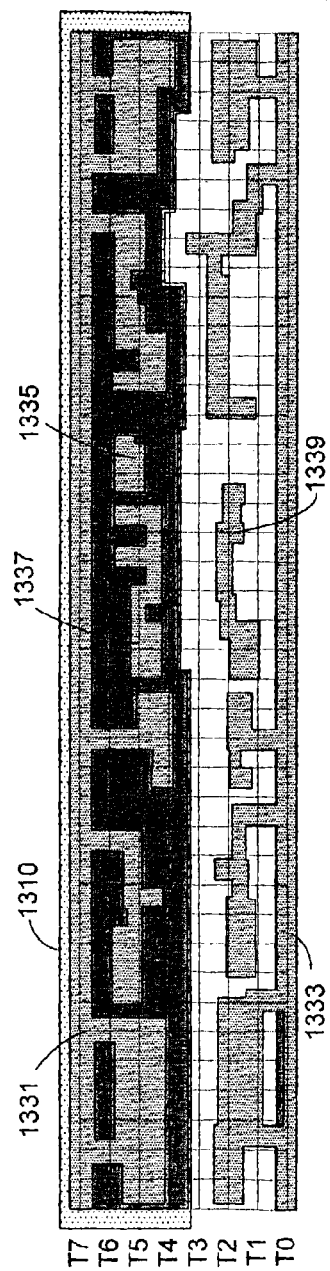
Figure 13D:
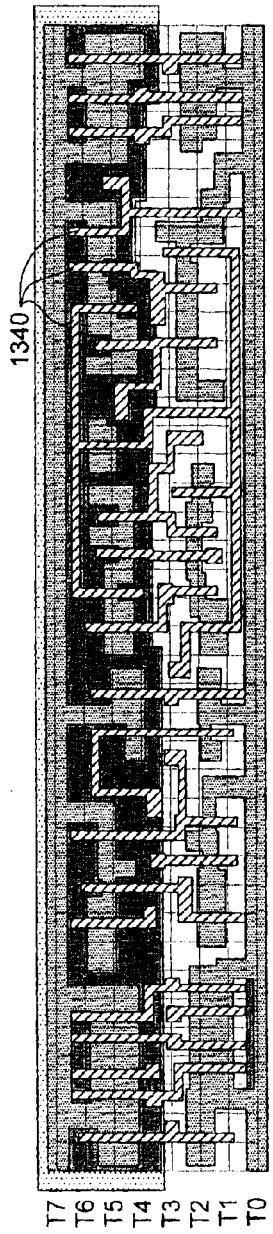
Figure 13E:
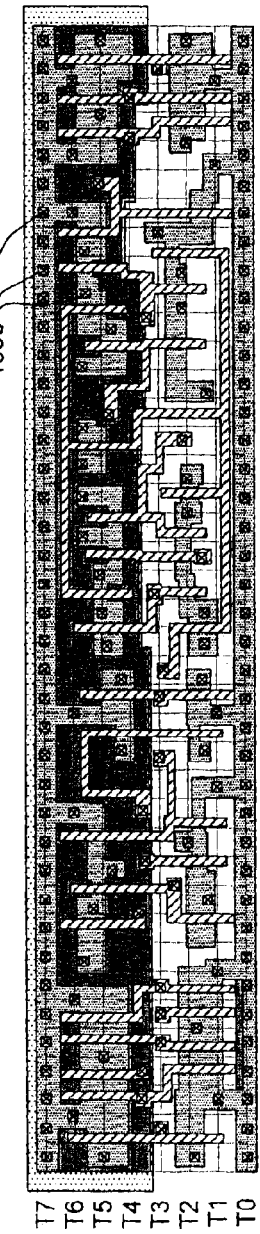
Figure 13F:
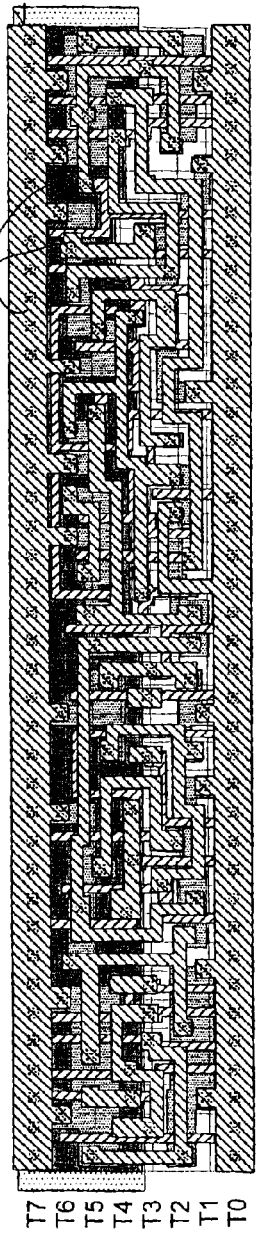
Figure 13G:
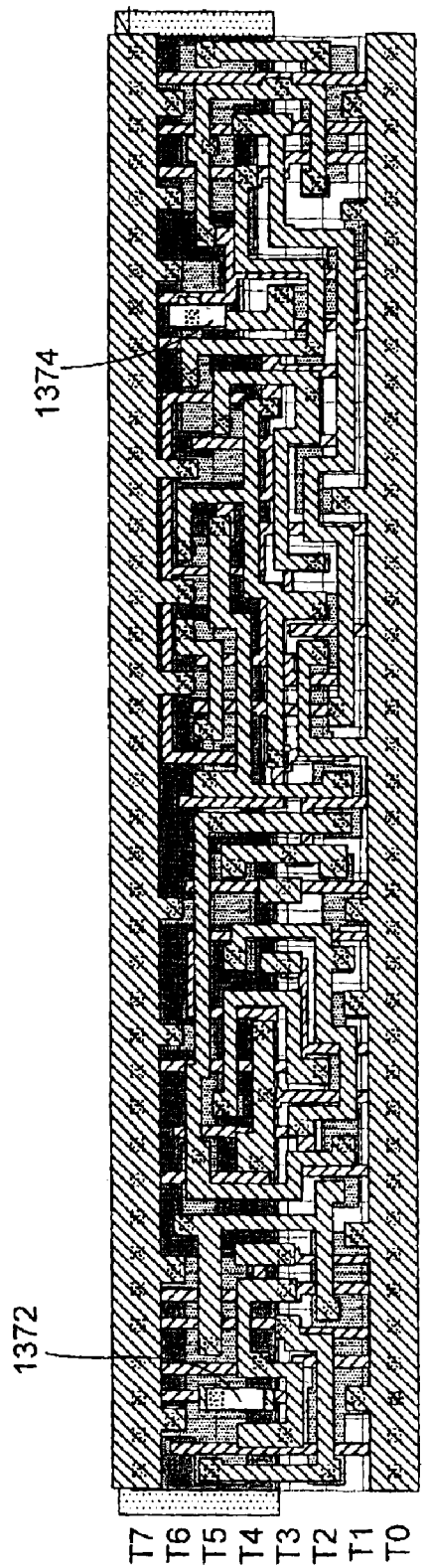
Figure 13H:
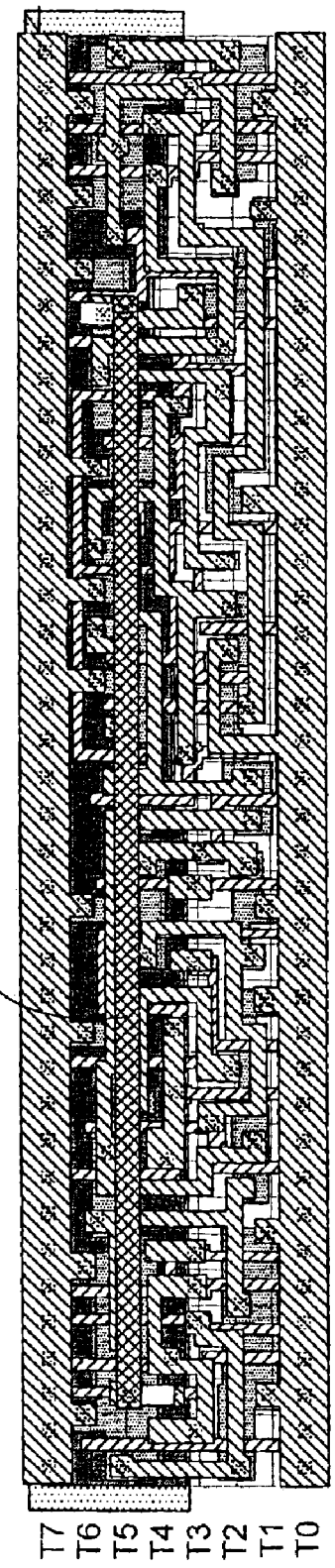

FIGS. 13(A) through 13(F) depict the design of flip-flop circuit 1200 according to the present invention in which an M3 structure is needed to complete the necessary internal cell connections. Referring to FIG. 13(A), the design of flip-flop circuit 1200 begins with the formation of N-well regions 1310 in the upper portion of the layout grid pattern (i.e., extending from a point just above track T7 to a point just above track T3). Next, as shown in FIG. 13(B), a first P-implant region 1322 is formed in N-well 1310, and a second P-implant region 1324 is formed along track T0. As shown in FIG. 13(C), an upper diffusion regions 1331 and a lower diffusion region 1333 are then defined, along with separate diffusion regions 1335, 1337, and 1339. Note that diffusion region 1331 includes a portion aligned along uppermost track T7, which forms part of the $V_{DD}$ power rail structure, and additional structures that combine with diffusion regions 1335 and 1337 to form portions of the P-channel transistors of flip-flop circuit 1200. Similarly, diffusion region 1333 includes a portion aligned along lowermost track T0, which forms part of the $V_{SS}$ power rail structure, and additional structures extending from this lower section that combine with structure 1339 to form portions of the N-channel transistors of flip-flop circuit 1200. Next, as shown in FIG. 13(D), multiple polysilicon structures 1340 are defined that extend over the various diffusion regions to form gate structures for the various N-channel and P-channel transistors. As shown in FIG. 13(E), multiple via structures 1350 are then defined over associated polysilicon structures and diffusion regions. Next, as indicated in FIG. 13(F), multiple M1 structures 1360 are defined to provide necessary internal cell connections (e.g., nets 1230; see FIG. 12) for linking the various transistors formed by the underlying structures to produce flip-flop circuit 1200. Note, however, that all of the horizontal routing tracks are utilized, and that net 1230A (see FIG. 12) is yet to be provided. According to the present invention, this problem is addressed by providing an M3 structure arranged along track T5 to provide the necessary feedback path. Referring to FIG. 13(G), the process of forming this M3 structure first requires the formation of M2 pads 1372 and 1374, along with associated via structures (indicated in dashed lines) for connection to the underlying M1 structures. Next, as indicated 13(H), an M3 structure 1380 is provided along with associated via structures (indicated in dashed lines) for connection to the underlying M2 pads 1372 and 1374.

Using the methods set forth above, a 7-track standard cell library including both "simple" cells (e.g., inverter 1100, described above) and "complex cells" (e.g., flip-flop circuit 1200) is produced that facilitates the fabrication of ASICs using the methods described above with reference to conventional ASIC formation. In particular, the layout designs are captured in a manner such that selected cells can be combined to form a user's ASIC utilizing conventional place and route software tools, layout software tools, mask generation tools, and fabrication equipment in the manner described above.

According to another aspect of the present invention, the method set forth above facilitates the generation of a 7-track standard cell library for producing ASICs that have layout areas at least 30% smaller and consume approximately 50% less power than ASICs produced using conventional standard cell ASICs using 0.12 um fabrication techniques and utilizing the same operating voltage (e.g., 1.35 Volts). By reducing the layout grid pattern from the conventional ten or more tracks to seven tracks, the layout size of each cell is significantly reduced. Therefore, when the 7-track standard cell library is utilized to form an ASIC in the manner described above, overall production yields are increased because each ASIC is smaller, and more ASICs can be produced on a single wafer, thereby significantly reducing per-chip manufacturing costs. Moreover, only a small speed penalty (between 2 and 7%) is introduced in ASICs produced using the 7-track standard cell library, when compared to ASICs produced using conventional 0.12 um standard cell libraries. Further, ASICs produced using the 7-track standard cell library support substantially lower operating voltages (e.g., 0.72 Volts, versus the 1.35 Volts required in conventional 0.12 standard cell ASICs), thereby facilitating power savings of up to 82% (although this lower operating voltage can introduce a speed penalty of approximately 67%).

Although the present invention has been described with respect to certain specific embodiments, it will be clear to those skilled in the art that the inventive features of the present invention are applicable to other embodiments as well, all of which are intended to fall within the scope of the present invention. For example, the methods described herein can be utilized to produce a standard cell library including many types of cells, not just those discussed herein. In addition, the sequence of structure definitions set forth in the flow diagram of FIG. 10 is intended to be exemplary, and it is understood that the various structure definitions may be combined and/or defined in any order.

What is claimed is:

1. A 7-track standard cell library for fabricating standard cell Application-Specific Integrated Circuit (ASICs) using a fabrication technology that includes sequentially-formed metal layers M1, M2, and M3, wherein the standard cell library comprises a plurality of complex cells having a cell height defined by seven equally-spaced horizontal routing tracks located between an uppermost horizontal track and a lowermost horizontal track, wherein each complex cell includes internal cell connections comprising first structures formed from the M1 metal layer, and a second structure formed from the M3 metal layer, wherein the second structure is aligned along a predetermined horizontal track of said each complex cell.

2. The 7-track standard cell library according to claim 1, wherein the second structure of each said complex cell is aligned along the second horizontal track from the uppermost horizontal track.

3. The 7-track standard cell library according to claim 1, wherein the second structure of each said complex cell further comprises a first pair of via structures respectively connecting opposite ends of the second structure to corresponding pads formed from the M2 metal layer, and a second pair of via structured connecting the corresponding pads to corresponding first structures formed from the M1 metal layer.

4. The 7-track standard cell library according to claim 1, wherein each said complex cell has a cell height of 2.8 microns, and wherein said internal cell connections are arranged along a routing grid having horizontal and vertical track spacings of 0.4 microns.

5. An Application-Specific Integrated Circuit (ASIC) comprising a plurality of cells arranged on a substrate and fabricated using a fabrication technology defining sequentially-formed metal layers M1, M2, and M3, wherein the ASIC comprises a plurality of complex cells having a cell height defined by seven equally-spaced horizontal routing tracks located between an uppermost horizontal track and a lowermost horizontal track, wherein each complex cell includes internal cell connections comprising first structures formed from the M1 metal layer, and a second structure formed from the M3 metal layer, wherein the second structure is aligned along a predetermined horizontal track of said each complex cell.

6. The ASIC of claim 5, wherein each complex cell comprises power rails formed by first and second structures formed from the M1 metal layer, and respectively aligned along an uppermost and a lowermost horizontal track of said each cell.

7. The ASIC of claim 6, wherein the ASIC further comprises a 0.72 Volt power supply coupled to the first power rail structure, and a 0 Volt power supply coupled to the second power rail structure.

8. The ASIC according to claim 5, wherein the second structure of each said complex cell is aligned along the second horizontal track from the uppermost horizontal track.

9. The ASIC according to claim 5, wherein the second structure of each said complex cell further comprises a first pair of via structures respectively connecting opposite ends of the second structure to corresponding pads formed from the M2 metal layer, and a second pair of via structured connecting the corresponding pads to corresponding first structures formed from the M1 metal layer.

10. The ASIC according to claim 5, wherein each said complex cell has a cell height of 2.8 microns, and wherein said internal cell connections are arranged along a routing grid having horizontal and vertical track spacings of 0.4 microns.

11. The ASIC of claim 5, wherein each cell comprises power rails formed by first and second structures formed from the M1 metal layer, and respectively aligned along an uppermost and a lowermost horizontal track of said each cell.

12. A method for forming a standard cell library for fabricating standard cell Application-Specific Integrated Circuit (ASICs) using a fabrication technology that includes sequentially-formed metal layers M1, M2, and M3, wherein the method comprises forming a standard cell library including a plurality of complex cells having a cell height defined by seven equally-spaced horizontal routing tracks located between an uppermost horizontal track and a lowermost horizontal track, wherein each complex cell includes internal cell connections comprising first structures formed from the M1 metal layer, and a second structure formed from the M3 metal layer, wherein the second structure is aligned along a predetermined horizontal track of said each complex cell.

13. The method according to claim 12, wherein forming the second structure of each said complex cell comprises aligning said second structure along the second horizontal track from the uppermost horizontal track.

14. The method according to claim 13, wherein forming the second structure of each said complex cell further comprises forming a first pair of via structures respectively connecting opposite ends of the second structure to corresponding pads formed from the M2 metal layer, and forming a second pair of via structured connecting the corresponding pads to corresponding first structures formed from the M1 metal layer.

* * * * *